(12) United States Patent
Twynam

(10) Patent No.: US 6,399,969 B1
(45) Date of Patent: Jun. 4, 2002

(54) HETEROJUNCTION BIPOLAR TRANSISTOR INCLUDING COLLECTOR/BASE HETEROJUNCTION ACHIEVING HIGH OPERATION EFFICIENCY

(75) Inventor: John Kevin Twynam, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/573,892

(22) Filed: May 19, 2000

(30) Foreign Application Priority Data

May 20, 1999 (JP) .......................................... 11-140124

(51) Int. Cl.[7] .......................................... H01L 31/0328
(52) U.S. Cl. ...................... 257/191; 257/197; 257/198; 257/190
(58) Field of Search ................................. 257/197, 183, 257/191, 565, 592, 593

(56) References Cited

U.S. PATENT DOCUMENTS 5,606,185 A * 2/1997 Nguyen et al. ............. 257/197
5,798,277 A * 8/1998 Ryum et al. .................. 437/31

OTHER PUBLICATIONS

Zhang et al., IEEE, vol. 39, No. 10, pp. 2220–2228 (1992) (Oct.)BT.
Liu et al., American Institute of Physics, vol. 73, No. 10, pp. 1397–1399 (1998) (Sep.).
Analysis of the Emitter–Down Configuration of DHBT.
Application of δdoped Wide–Gap Collector Structure for High Breakdown Transistor.

* cited by examiner

Primary Examiner—David Nelms
Assistant Examiner—Tu-Tu Ho

(57) ABSTRACT

A hetero junction bipolar transistor has an emitter region, a base region, a collector region and a subcollector region which are serially arranged. The collector region includes a plurality of sub-regions. An energy bandgap in each of the sub-regions is constant or linearly changes, and an energy band edge where mobile charge carriers run in the collector region is continuous at each boundary between the sub-regions. Two-dimensional or quasi-two-dimensional charge layer is formed at the boundary of the sub-regions so as to compensate quasi-electric field caused by differences in electron affinity and energy bandgap between the sub-regions. The mobile charge carriers pass through the collector region from the base region without encountering barriers and thereby this heterojunction bipolar transistor achieves a high operating efficiency.

6 Claims, 8 Drawing Sheets

Vbe=1.4V
Vce=2V

Vbe=1.4V
Vce=0.1V

Vbe=1.4V
Vce=2V

Vbe=1.4V
Vce=0.1V

US 6,399,969 B1

HETEROJUNCTION BIPOLAR TRANSISTOR INCLUDING COLLECTOR/BASE HETEROJUNCTION ACHIEVING HIGH OPERATION EFFICIENCY

BACKGROUND OF THE INVENTION

The present invention relates to a heterojunction bipolar transistor, and in particular, to a bipolar transistor that has a collector/base heterojunction.

As a conventional heterojunction bipolar transistor, there has conventionally been known a double heterojunction bipolar transistor (DHBT) such that a graded layer whose bandgap linearly changes in the direction of thickness thereof is interposed between a collector and a base in order to remove band discontinuity at a heterojunction located between the collector and the base (the junction being referred to as a collector/base heterojunction hereinafter) (Q. M. Zhang et al., "Analysis of the Emitter-Down Configuration of Double-Heterojunction Bipolar Transistor", IEEE Transactions On The Electron Devices, vol. 39 No. 10, pp. 2220–2229, 1992). As another double heterojunction bipolar transistor, there is known one such that a setback layer that has a high concentration and a narrow bandgap is interposed between the collector and the base in order to lower a barrier at the collector/base heterojunction (W-C. Liu et al., "Application of $\delta$-doped wide-gap collector structure for high-breakdown and low-offset voltage transistors", Applied Physics Letters, vol. 73 No. 10, pp. 1397–1399, 1998).

The graded layer and setback layer reduce to some extent the barrier viewed from mobile charge carriers. However, these layers cannot completely remove the barrier. This becomes significant particularly when a bias voltage is low, i.e., when the transistor is operated under bias conditions near a saturation region.

For example, FIG. 3A shows a calculated energy band diagram of an npn type DHBT provided with the aforementioned graded layer when a bias set sufficiently away from the saturation region (a base-emitter voltage Vbe=1.4 V and a collector-emitter voltage Vce=2 V) is applied to the DHBT. FIG. 3B shows a calculated energy band diagram of the same DHBT operated with a bias set near the saturation region (a base-emitter voltage Vbe=1.4 V and a collector-emitter voltage Vce=0.1 V). This npn type DHBT is constructed of an n-type $Al_{0.3}Ga_{0.7}As$ emitter layer (having a thickness of 800 Å and an impurity concentration n=$5 \times 10^{17}$ cm$^{-3}$) 31, an $Al_xGa_{1-x}As$ emitter graded layer (having a thickness of 200 Å, an impurity concentration n=$5 \times 10^{17}$ cm$_{-3}$ and an Al mole fraction x=0.3→0) 32, a p$^+$-type GaAs base layer (having a thickness of 800 Å and an impurity concentration n=$4 \times 10^{19}$ cm$^{-3}$) 33, an n-type $Al_xGa_{1-x}As$ graded layer (having a thickness of 500 Å, an impurity concentration n=$2 \times 10^{16}$ cm$^{-3}$ and an Al mole fraction x=0→0.2) 34, an n-type $Al_{0.2}Ga_{0.8}As$ collector layer (having a thickness of 6000 Å and an impurity concentration n=$2 \times 10^{16}$ cm$^{-3}$) 35, an $Al_xGa_{0.8}As$ graded layer (having a thickness of 500 Å, an impurity concentration n=$2 \times 10^{16}$ cm$^{-3}$ and an Al mole fraction x=0.2→0) 36 and an n-type GaAs subcollector layer (having a thickness of 1000 Å and an impurity concentration n=$5 \times 10^{18}$ cm$^{-3}$) 37. The arrow "→" between the numbers of the Al mole fraction x means that the value of the Al mole fraction x linearly changes in the direction of thickness of the layer. FIGS. 3A and 3B show that a collector/base heterojunction barrier 39 cannot be sufficiently reduced by the graded layer when the bias voltage is low.

FIG. 4A shows a calculated energy band diagram of an npn type DHBT provided with the aforementioned setback layer when a bias set sufficiently away from a saturation region (a base-emitter voltage Vbe=1.4 V and a collector-emitter voltage Vce=2 V) is applied to the DHBT. FIG. 4B shows a calculated energy band diagram of the same DHBT operated with a bias set near the saturation region (a base-emitter voltage Vbe=1.4 V and a collector-emitter voltage Vce=0.1 V). This npn type DHBT is constructed of an n-type $Al_{0.3}Ga_{0.7}As$ emitter layer (having a thickness of 800 Å and n=$5 \times 10^{17}$ cm$^{-3}$) 41, an $Al_xGa_{1-x}As$ emitter graded layer (having a thickness of 200 Å, an impurity concentration n=$5 \times 10^{17}$ cm$^{-3}$ and an Al mole fraction x=0.3→0) 42, a p$^+$-type GaAs base layer (having a thickness of 800 Å and an impurity concentration n=$4 \times 10^{19}$ cm$^{-3}$) 43, an n-type GaAs setback layer (having a thickness of 500 Å, an impurity concentration n=$2 \times 10^{17}$ cm$^{-3}$) 44, an n-type $Al_{0.2}Ga_{0.8}As$ collector layer (having a thickness of 6000 Å and an impurity concentration n=$2 \times 10^{16}$ cm$^{-3}$) 45, an n-type $Al_{0.2}Ga_{0.8}As$ collector layer (having a thickness of 500 Å and an impurity concentration n=$2 \times 10^{18}$ cm$^{-3}$) 46 and an n-type GaAs subcollector layer (having a thickness of 1000 Å and an impurity concentration n=$5 \times 10^{18}$ cm$^{-3}$) 47. FIGS. 4A and 4B show that a collector/base heterojunction barrier 49 cannot be sufficiently reduced by the setback layer when the bias voltage is low.

FIG. 5A shows a calculated energy band diagram of an npn type DHBT provided with a $\delta$-doped layer in addition to the aforementioned setback layer when a bias set sufficiently away from a saturation region (a base-emitter voltage Vbe=1.4 V and a collector-emitter voltage Vce=2 V) is applied to the DHBT. FIG. 5B shows a calculated energy band diagram of the same DHBT operated with a bias set near the saturation region (a base-emitter voltage Vbe=1.4 V and a collector-emitter voltage Vce=0.1 V). This npn type DHBT is constructed of an n-type $Al_{0.3}Ga_{0.7}As$ emitter layer (having a thickness of 800 Å and n=$5 \times 10^{17}$ cm$^{-3}$) 51, an $Al_xGa_{1-x}As$ emitter graded layer (having a thickness of 200 Å, n=$5 \times 10^{17}$ cm$^{-3}$ and an Al mole fraction x=0.3→0) 52, a p$^+$-type GaAs base layer (having a thickness of 800 Å and an impurity concentration n=$4 \times 10^{19}$ cm$^{-3}$) 53, an n-type GaAs setback layer (having a thickness of 500 Å, an impurity concentration n=$2 \times 10^{16}$ cm$^{-3}$) 54, a $\delta$-doped layer (donor 2-dimensional doping density Ns=$5 \times 10^{11}$ cm$^{-2}$) 55, an n-type $Al_{0.2}Ga_{0.8}As$ collector layer (having a thickness of 6000 Å and an impurity concentration n=$2 \times 10^{16}$ cm$^{-3}$) 56, an n-type $Al_{0.2}Ga_{0.8}As$ collector layer (having a thickness of 500 Å and an impurity concentration n=$2 \times 10^{18}$ cm$^{-3}$) 57 and an n-type GaAs subcollector layer (having a thickness of 1000 Å and an impurity concentration n=$5 \times 10^{18}$ cm$^{-3}$) 58. FIGS. 5A and 5B show that a collector/base heterojunction barrier 59 cannot be sufficiently reduced when the bias voltage is low even if the $\delta$-doped layer is provided in addition to the setback layer.

SUMMARY OF THE INVENTION

Accordingly, an object of the present invention is to provide a heterojunction bipolar transistor including a collector/base heterojunction such that mobile charge carriers can pass through a collector region from a base region without encountering any barrier, therefore achieving a high operating efficiency.

In order to achieve the above object, the present invention provides a heterojunction bipolar transistor having an emitter region, a base region, a collector region and a subcollector region, which are sequentially arranged in one direction, wherein the collector region includes a plurality of adjacent sub-regions with respect to a thickness direction in which mobile charge carriers move, an energy bandgap in each of the sub-regions is either constant or linearly changes with a position in the thickness direction, an energy band edge where the mobile charge carriers in the collector region run is continuous between the adjacent sub-regions, and a 2-dimensional or quasi-2-dimensional charge layer is formed at an interface between the adjacent sub-regions so as to compensate a quasi-electric field caused by differences in electron affinity and energy bandgap between the adjacent sub-regions.

In the above invention, the term "2-dimensional charge layer" means a charge layer that has a thickness of zero, while the term "quasi-2-dimensional charge layer" means a charge layer that has a finite thickness.

The collector region of the heterojunction bipolar transistor of the present invention is divided into a plurality of sub-regions with respect to the thickness direction in which the mobile charge carriers move. The energy bandgap of each of the sub-regions is constant or linearly changes with the position in the thickness direction, and the energy band edge where the mobile charge carriers in the collector region run is continuous between the sub-regions. That is to say, electrons in the conduction band are the mobile charge carriers in the case of a npn type bipolar transistor, and the conduction band edge where the electrons run is continuous. Holes in the valence band are the mobile charge carriers in the case of a pnp type bipolar transistor, and the conduction band edge where the holes run is continuous. With this arrangement, a continuous potential profile is obtained due to the mobile charge carriers that cross the collector region in the thickness direction. Even if a graded layer in which its energy bandgap linearly changes is inserted between the sub-regions that have mutually different energy bandgaps with the position in the thickness direction, then the insertion of the graded layer is solely insufficient for giving a smooth and barrier-free potential to the mobile charge carriers. This is because a quasi-electric field is generated depending on differences in electron affinity and energy bandgap between the sub-regions. According to the present invention, the 2-dimensional or quasi-2-dimensional charge layer is formed at the interface between the adjacent sub-regions so as to compensate the aforementioned quasi-electric field. By inserting the 2-dimensional charge density between the sub-regions, the energy band edge is flattened. This arrangement reduces a barrier height of the mobile charge carriers and improves an operating efficiency. In this stage, it is preferable to sufficiently flatten the energy band edge by appropriately inserting the 2-dimensional charge density between the sub-regions so as to completely compensate the quasi-electric field, substantially removing the barrier of the mobile charge carriers. In particular, by making the entire collector region have a structure of the sub-regions according to the present invention, the mobile charge carriers is allowed to pass through the collector region from the base region without substantially encountering any barrier. In the above case, a specifically high operating efficiency can be achieved.

In one embodiment of the present invention, the heterojunction bipolar transistor is an npn type transistor, the energy band edge of a conduction band is continuous between the adjacent sub-regions, and a 2-dimensional charge density Ns of the 2-dimensional or quasi-2-dimensional charge layer is set so as to satisfy a relationship shown by a following expression (1):

$$Ns = (\epsilon_1 d\chi_1/dz - \epsilon_2 d\chi_2/dz)/q \quad (1)$$

where q is an electron charge, $\chi_1$ and $\chi_2$ are an electron affinity of a first sub-region and a second sub-region between which the charge layer is interposed, $\epsilon_1$ and $\epsilon_2$ are a permittivity at an interface between the first sub-region and the second sub-region, and z is a coordinate system which is perpendicular to the interface between the first sub-region and the second sub-region and in which a direction directed from the first sub-region to the second sub-region is positive.

The fact that Ns is positive means that the electric charge layer is constructed of acceptor ions, and the fact that Ns is negative means that the electric charge layer is constructed of donor ions.

In general, the condition required for unimpeded movement of the mobile charge carriers through the semiconductor having specified spatial charges is that differentiation of the quasi-electric field F by the position z i.e. differential dF/dz is continuous throughout the entire region. With regard to the conduction band of the semiconductor, the quasi-electric field Fc of the conduction band is expressed by:

$$Fc = -d\chi/dz \quad (5)$$

where $\chi$ is the electron affinity. Therefore, it can be understood that discontinuities of dFc/dz at the boundaries of the sub-regions are canceled by the insertion of the 2-dimensional or quasi-2-dimensional charge layer, which has the 2-dimensional charge density Ns expressed by the aforementioned equation (1), between the sub-regions. Therefore, according to this embodiment, the mobile charge carriers can pass through the collector region from the base region without encountering the barrier in the npn type heterojunction bipolar transistor, and this can consequently achieve a high operating efficiency.

In one embodiment of the present invention, the plurality of sub-regions of the npn type heterojunction bipolar transistor are made of $Al_xGa_{1-x}As$, an Al mole fraction x of each of the sub-regions is constant or linearly changes with the position in the thickness is direction, the Al mole fractions x of the adjacent sub-regions are coincident with each other at the interface between the adjacent sub-regions, a 2-dimensional or quasi-2-dimensional charge layer is formed the interface of the adjacent sub-regions, and the 2-dimensional charge density Ns of the 2-dimensional or quasi-2-dimensional charge layer is set so as to satisfy a relationship shown by a following expression (2):

$$Ns = 0.8\epsilon(dx_1/dz - dx_2/dz)/q \quad (2)$$

where q is the electron charge, $x_1$ and $x_2$ are an Al mole fraction of the first sub-region and the second sub-region between which the charge layer is interposed, $\epsilon$ is a permittivity at the interface between the first sub-region and the second sub-region, and z is the coordinate system which is perpendicular to the interface between the first sub-region and the second sub-region and in which a direction directed from the first sub-region to the second sub-region is positive.

If the sub-region is constructed of $Al_xGa_{1-x}As$ (GaAs if x=0), then the aforementioned equation (1) can be rewritten into the equation (2) by the Al mole fraction x of $Al_xGa_{1-x}As$. This is because the electron affinity $\chi(x)$ of $Al_xGa_{1-x}As$ is experimentally expressed by the Al mole fraction x as follows:

$$\chi(x) = \chi_0 - 0.8x \quad (6)$$

where $\chi_0$ is the electron affinity of GaAs when x=0. Therefore, according to this embodiment, the mobile charge carriers can pass through the collector region from the base region without encountering the barrier in the npn type heterojunction bipolar transistor whose collector region includes a GaAs/AlGaAs-based material, and this can consequently achieve a high operating efficiency.

In one embodiment of the present invention, the heterojunction bipolar transistor is a pnp type transistor, the energy band edge of a valence band is continuous between the adjacent sub-regions, and a 2-dimensional charge density Ns of the 2-dimensional or quasi-2-dimensional charge layer is set so as to satisfy a relationship shown by a following expression (3):

$$Ns=(\epsilon_1 d_{\chi_1}/dz-\epsilon_2 d_{\chi_2}/dz+(dE_{G1}/dz-dE_{G2}/dz)/q)/q \qquad (3)$$

where q is an electron charge, $\chi_1$ and $\chi_2$ are an electron affinity of a first sub-region and a second sub-region between which the charge layer is interposed, $\epsilon_1$ and $\epsilon_2$ are a permittivity at an interface between the first sub-region and the second sub-region, z is a coordinate system which is perpendicular to the interface of the first sub-region and second sub-region and in which a direction directed from the first sub-region to the second sub-region is positive, and $E_{G1}$ and $E_{G2}$ are an energy gap of the first sub-region and second sub-region.

The fact that Ns is positive means that the electric charge layer is constructed of acceptor ions, and the fact that Ns is negative means that the electric charge layer is constructed of donor ions.

As already described hereinabove, the condition required for the unimpeded movement of mobile charge carriers through the semiconductor having specified spatial charges is that differentiation of the quasi-electric field F by the position z i.e. differential dF/dz is continuous throughout the region. With regard to the valence band of the semiconductor, the quasi-electric field Fv of the valence band is expressed by:

$$Fv=-d(\chi+E_G/q)/dz \qquad (7)$$

where $\chi$ is the electron affinity and $E_G$ is the energy bandgap. Therefore, it can be understood that the discontinuities of dFv/dz at the boundaries of the sub-regions are canceled by the insertion of the 2-dimensional or quasi-2-dimensional charge layer which has the 2-dimensional charge density Ns expressed by the aforementioned equation (3), into the interface between the sub-regions. Therefore, according to this embodiment, the mobile charge carriers can pass through the collector region from the base region without encountering any barrier in the pnp type heterojunction bipolar transistor, and this can consequently achieve a high operating efficiency.

In one embodiment of the present invention, the plurality of sub-regions of the pnp type heterojunction bipolar transistor are made of $Al_xGa_{1-x}As$, an Al mole fraction x of the sub-region is constant or linearly changes with the position in the thickness direction, the Al mole fractions x of the adjacent sub-regions are coincident with each other at the interface between the adjacent sub-regions, a 2-dimensional or quasi-2-dimensional charge layer is formed on the interface between the sub-regions, and the 2-dimensional charge density Ns of the charge layer is set so as to satisfy a relationship shown by a following expression (4):

$$Ns=0.45\epsilon(dx_1/dz-dx_2/dz)/q \qquad (4)$$

where q is the electron charge, $x_1$ and $x_2$ are an Al mole fraction of the first sub-region and the second sub-region between which the charge layer is interposed, $\epsilon$ is an permittivity at the interface between the first sub-region and the second sub-region, and z is a coordinate system which is perpendicular to the interface between the first sub-region and the second sub-region and in which a direction directed from the first sub-region to the second sub-region is positive.

If the sub-region is constructed of $Al_xGa_{1-x}As$ (GaAs if x=0), then the aforementioned equation (3) can be rewritten into the equation (4) by the Al mole fraction x of $Al_xGa_{1-x}As$. This is because the electron affinity $\chi(x)$ of $Al_xGa_{1-x}As$ and the band gap E(x) are experimentally expressed by the Al mole fraction x as follows:

$$\chi(x)=\chi_0-0.8x \qquad (6)$$

and $$E(x)=E_{G0}+1.247x \qquad (8)$$

where $\chi_0$ is the electron affinity of GaAs when x=0 and $E_{G0}$ is the band gap of GaAs when x=0. Therefore, according to this embodiment, the mobile charge carriers can pass through the collector region from the base region without encountering the barrier in the pnp type heterojunction bipolar transistor whose collector region includes a GaAs/AlGaAs-based material, and this can consequently achieve a high operating efficiency.

In one embodiment of the present invention, the collector region of the npn type heterojunction bipolar transistor is comprised of the first sub-region located on a base layer side and the second sub-region located on a subcollector side, and the Al mole fraction x of each of the sub-regions is set so as to linearly increase toward the second sub-region within the first sub-region and linearly decrease toward the subcollector region within the second sub-region.

According to the embodiment of the present invention, the barrier at the interface between the first and second sub-regions made of $Al_xGa_{1-x}As$ can be removed from the npn heterojunction bipolar transistor whose collector region is constructed of the GaAs/AlGaAs-based material. Therefore, the mobile charge carriers can pass through the collector region from the base region without encountering the barrier, and this can consequently achieve a high operating efficiency. The collector structure which has a high operating efficiency and in which the mobile charge carriers can pass through the collector region from the base region without encountering any barrier can be provided with a relatively simplified structure, and this provides great advantages in terms of fabrication.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
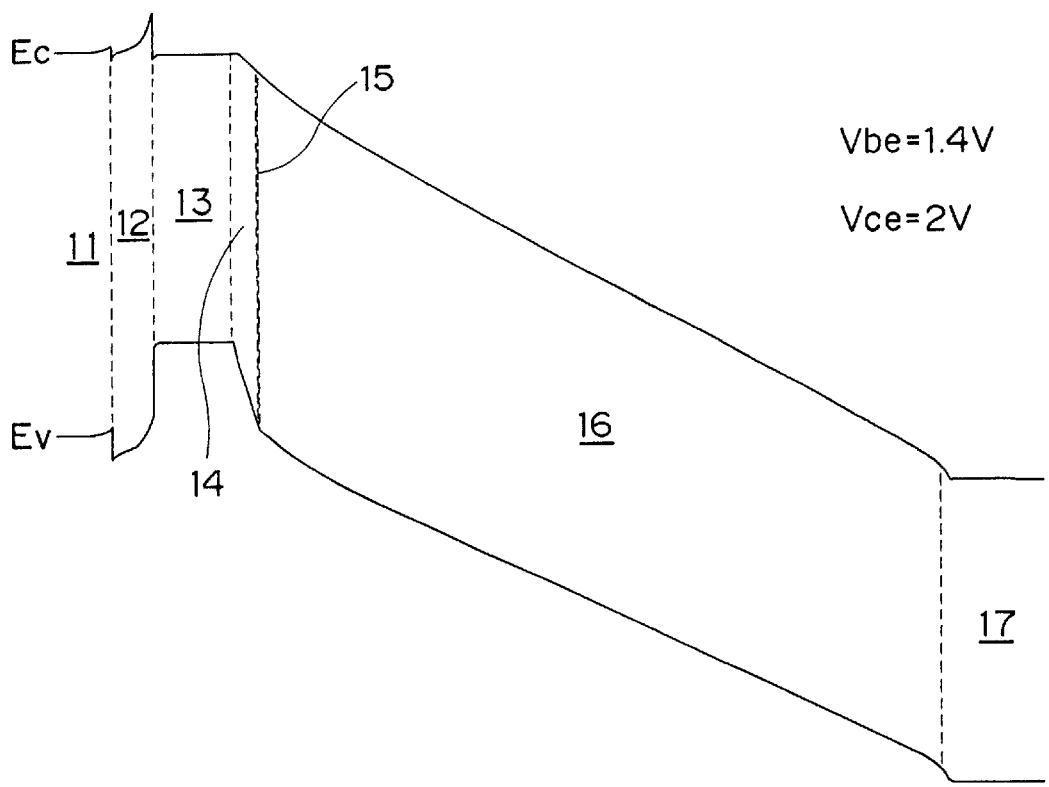
FIGS. 1A and 1B are energy band diagrams of a heterojunction bipolar transistor according to one embodiment of the present invention.

A heterojunction bipolar transistor of the present invention will be described in detail below on the basis of embodiments thereof shown in the drawings.

Figures 2A, 2B:
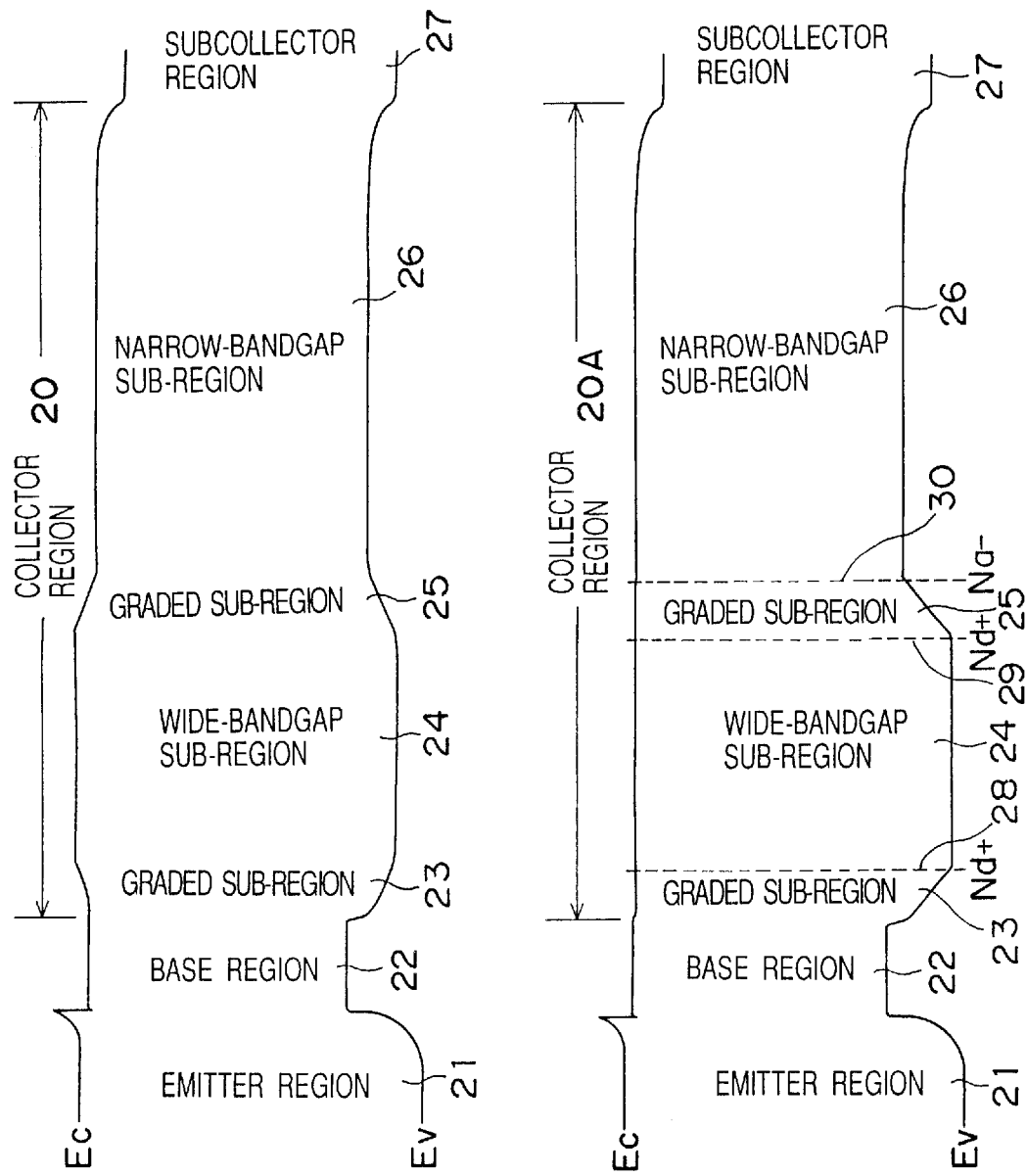
FIGS. 2A and 2B are diagrams schematically showing the effect of removing barriers in the heterojunction bipolar transistor of the present invention.

FIGS. 2A and 2B schematically show an effect of the present invention. FIG. 2A shows a calculated energy band diagram of an npn type AlGaAs/GaAs/AlGaAs heterojunction bipolar transistor, which includes a collector/base heterojunction and has no 2-dimensional charge layer at an interface between sub-regions that constitute a collector region 20, for comparison with the present invention, when this transistor is operated with a bias near a saturation region. This heterojunction bipolar transistor is provided with an n-type AlGaAs emitter layer 21, a p$^+$-type GaAs base region 22, an n-type $Al_xGa_{1-x}As$ graded sub-region (having a thickness of 50 nm and an Al mole fraction x=0→0.2) 23, an n-type $Al_{0.2}Ga_{0.8}As$ sub-region 24 having a uniform wide bandgap, an n-type $Al_xGa_{1-x}As$ graded sub-region (having a thickness of 50 nm and an Al mole fraction x=0.2→0) 25, an n-type GaAs sub-region 26 having a uniform narrow bandgap and an n-type GaAs subcollector region 27.

In contrast to this, FIG. 2B shows a calculated energy band diagram of a npn type AlGaAs/GaAs/AlGaAs heterojunction bipolar transistor that has 2-dimensional charge layers at interfaces between sub-regions that constitute a collector region 20A based on the present invention when the transistor is operated with a bias near the saturation region. In this heterojunction bipolar transistor, a 2-dimensional charge layer 28 is formed at an interface between the graded sub-region 23 and the wide bandgap sub-region 24, a 2-dimensional charge layer 29 is formed at an interface between the wide bandgap sub-region 24 and the graded sub-region 25 and a 2-dimensional charge layer 30 is formed at an interface between the graded sub-region 25 and the narrow bandgap sub-region 26. Two-dimensional doping densities Ns of these 2-dimensional charge layers 28, 29 and 30 are each set so as to satisfy the following relationship:

$$Ns=0.8\epsilon(dx_1/dz-dx_2/dz)/q \tag{2}$$

where q is an electron charge, $x_1$ and $x_2$ are Al mole fractions of the first and second sub-regions between which the charge layer is interposed, $\epsilon$ is a permittivity at the interface between the first and second sub-regions, and z is a coordinate system which is perpendicular to the interface between the first and second sub-regions and in which a direction directed from the first sub-region to the second sub-region is positive.

Comparing FIG. 2A and FIG. 2B with each other, it is understood that a band edge Ec in a conduction band of FIG. 2B is continuous and smooth in the collector region 20A. Therefore, according to the present invention, mobile charge carriers can pass through the collector region 20A from the base region 22 without encountering barriers.

An idealistic thickness of the charge layer to be inserted between the sub-regions is zero. As a thickness of the charge layer to be inserted therebetween increases, the effect of removing the potential barrier at the boundaries of the sub-regions reduces. In this case, when an extremely high 2-dimensional doping density is employed, it is required to set the thickness of the charge layer to be inserted between the sub-regions to a finite value due to limitations in the maximum 3-dimensional doping density imposed by the physical properties or the device fabricating method. However, a great effect is obtained if a barrier height at the boundaries of the sub-regions is not higher than an approximate thermal energy 3 kT/2 of the mobile charge carriers (note that k is the Boltzmann's constant and T is the absolute temperature).

Therefore, the proper upper limit of thickness $\Delta z$ of the charge layer to be inserted between the sub-regions of the collector region can be calculated to be:

$$\Delta z \leq 3kT/\{2q|d_{\chi 1}/dz - d_{\chi 2}/dz|\} \tag{9}$$

for an npn transistor.

The proper upper limit of the thickness $\Delta z$ of the charge layer to be inserted between the sub-regions of the collector region can be calculated to be:

$$\Delta z \leq 3kT/\{2q|(d_{\chi 1}/dz - d_{\chi 2}/dz) + (dE_{G1}/dz - dE_{G2}/dz)/q|\} \tag{10}$$

for a pnp transistor, where $\chi_1$ and $\chi_2$ are electron affinities of the first and second sub-regions and $E_{G1}$ and $E_{G2}$ are energy bandgaps of the first and second sub-regions between which the charge layer is interposed.

Even if the thickness $\Delta z$ of the charge layer exceeds the upper limit given by the equations (9) or (10), then the effect of the insertion of the charge layer does not immediately disappear. However, it is preferred that the thickness $\Delta z$ should not exceed the upper limit given by the equations (9) or (10). In regard to the following description, the term "2-dimensional doped layer" means a charge layer that is formed through doping and has a thickness of zero, while the term "quasi-2-dimensional doped layer" means a charge layer that is formed through doping and has a finite thickness.

FIG. 1A shows a calculated energy band diagram of an npn type heterojunction bipolar transistor according to one embodiment of the present invention when a bias set sufficiently away from a saturation region (a base-emitter voltage Vbe=1.4 V and a collector-emitter voltage Vce=2V) is applied to the transistor.

Figure 1B:
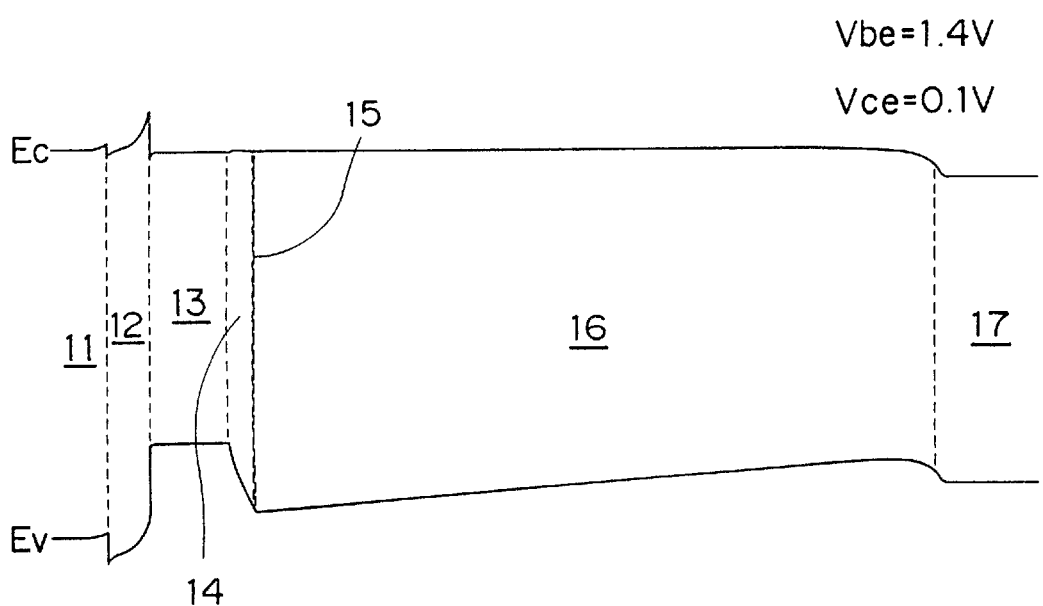

FIG. 1B shows a calculated energy band diagram of the same transistor operated with a bias set near the saturation region (a base-emitter voltage Vbe=1.4 V and a collector-emitter voltage Vce=0.1 V). This npn type heterojunction bipolar transistor is constructed of an n-type $Al_{0.3}Ga_{0.7}As$ emitter layer (having a thickness of 600 Å and an impurity concentration n=5×10$^{17}$ cm$^{-3}$) 11, an n-type $In_{0.5}Ga_{0.5}P$ emitter layer (having a thickness of 400 Å and an impurity concentration n=5×10$^{17}$ cm$^{-3}$) 12, a p$^+$-type GaAs base layer (having a thickness of 800 Å and an impurity concentration n=4×10$^{19}$ cm$^{-3}$) 13, an n-type $Al_xGa_{1-x}As$ graded collector layer (having a thickness of 250 Å, an impurity concentration n=2×10$^{16}$ cm$^{-3}$ and an Al mole fraction x=0→0.2) 14, an n-type $Al_xGa_{1-x}As$ graded collector layer (having a thickness of 6750 Å, an impurity concentration n=2×10$^{16}$ cm$_{-3}$ and an Al mole fraction x=0.2→0) 16, an n-type GaAs subcollector layer (having a thickness of 1000 Å and an impurity concentration n=5×10$^{18}$ cm$^{-3}$) 17, which are arranged in this order. In this example, a 2-dimensional doped layer (donor 2-dimensional doping density Ns=4.8× $10^{11}$ cm$^{-2}$) 15 doped with a donor impurity is formed at the interface between the graded collector layers 14 and 16, or the sub-regions that constitute the collector region. The value of the 2-dimensional doping density Ns of the 2-dimensional doped layer 15 is set according to the aforementioned equation (2).

FIGS. 1A and 1B show that a band edge Ec of the conduction band is continuous and smooth in the collector region. Therefore, the mobile charge carriers can pass through the collector region from the base region without encountering any barrier.

According to this example of calculation, the 2-dimensional doped layer 15 is assumed to have a thickness of zero. However, a great effect can be practically obtained if the thickness Δz of the charge layer (quasi-2-dimensional doped layer) is set to a finite value that satisfies the following equation:

$$\Delta z \leq 0.8 \times 3kT / \{2q|dx_2/dz - dx_1/dz|\} \tag{11}$$

obtained from the equations (6) and (9). The upper limit value of the thickness Δz is 5.8 nm at an operating junction temperature of 300 K and 11.7 nm at an operating junction temperature of 600 K by calculation.

At the interface where the free mobile charge density is extremely high like the interface between the collector region and the subcollector region or the interface between the base region and the collector region, the mobile charges move so as to compensate the quasi-electric fields. Therefore, it is not required to insert the 2-dimensional or quasi-2-dimensional doped layer. Furthermore, it is preferable to make continuous the energy band where the mobile charge carriers run in the collector as far as possible. However, a structure that is not recognized as a barrier (barrier of not greater than 3 KT/2) by the mobile charge carriers may, of course, exist.

Figure 6A:
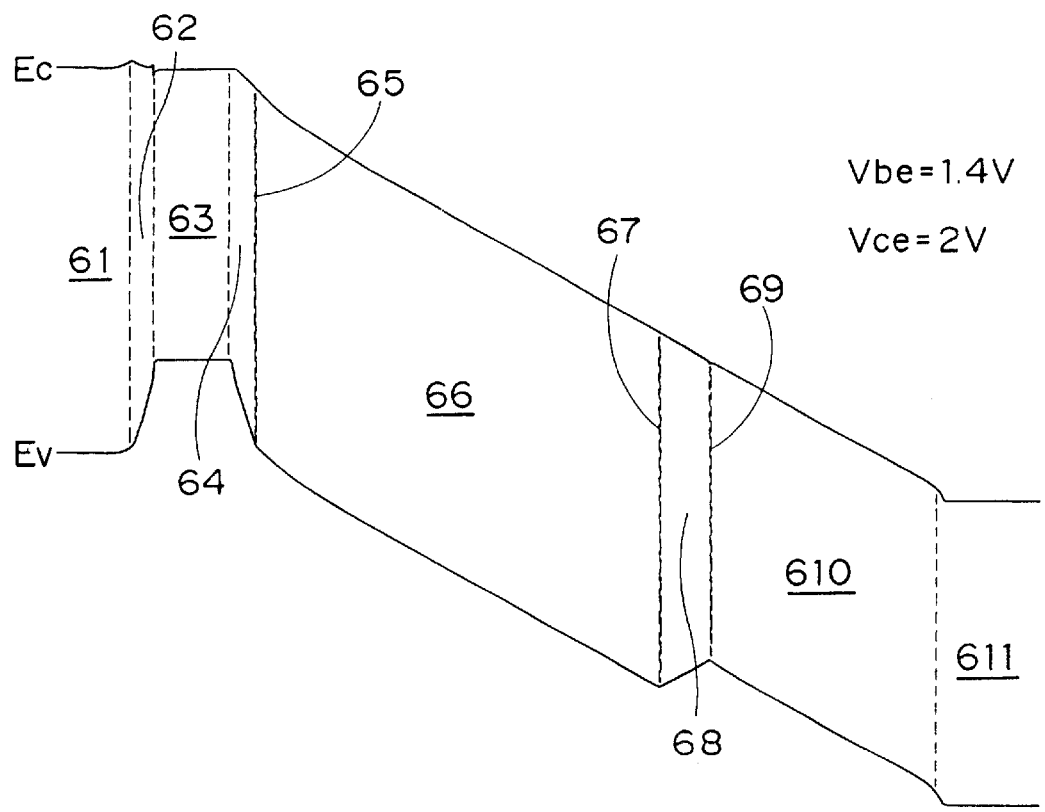
FIGS. 6A and 6B are energy band diagrams of a heterojunction bipolar transistor according to another embodiment of the present invention.

FIG. 6A shows a calculated energy band diagram of an npn type heterojunction bipolar transistor according to another embodiment of the present invention when a bias set sufficiently away from a saturation region (a base-emitter voltage Vbe=1.4 V and a collector-emitter voltage Vce=2 V) is applied to the transistor.

Figure 6B:
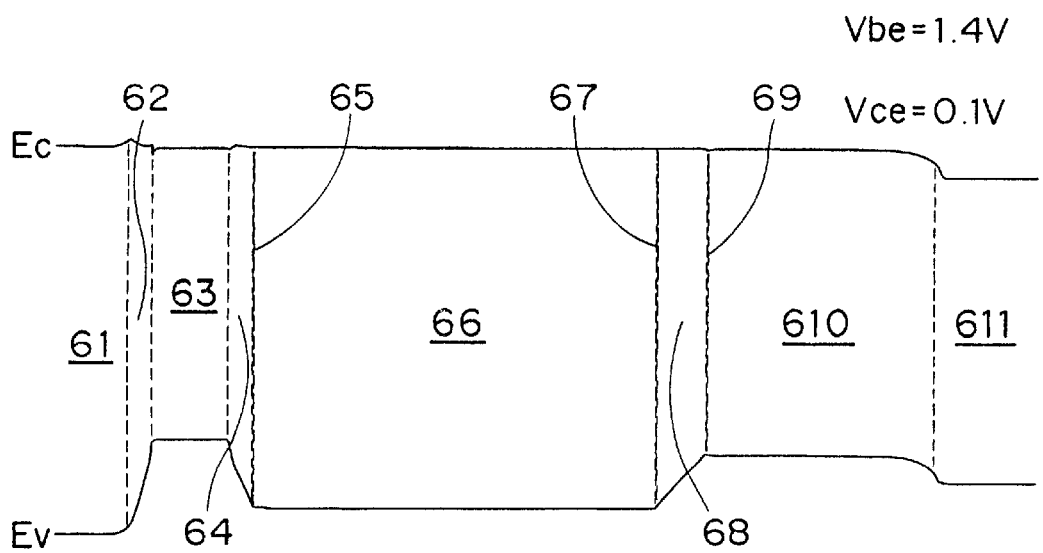

FIG. 6B shows a calculated energy band diagram of the same transistor operated near the saturation region (a base-emitter voltage Vbe=1.4 V and a collector-emitter voltage Vce=0.1 V). This npn type heterojunction bipolar transistor is constructed of an n-type $Al_{0.3}Ga_{0.7}As$ emitter layer (having a thickness of 800 Å and an impurity concentration n=5×$10^{17}$ cm$^{-3}$) 61, an n-type $Al_xGa_{1-x}As$ graded emitter layer (having a thickness of 200 Å, an impurity concentration n=5×$10^{17}$ cm$^{-3}$ and an Al mole fraction x=0.3→0) 62, a p$^+$-type GaAs base layer (having a thickness of 800 Å and an impurity concentration n=4×$10^{19}$ cm$^{-3}$) 63, an n-type $Al_xGa_{1-x}As$ graded collector layer (having a thickness of 250 Å, an impurity concentration n=2×$10^{16}$ cm$^{-3}$ and an Al mole fraction x=0→0.2) 64, an n-type $Al_{0.2}Ga_{0.8}As$ collector layer (having a thickness of 4000 Å and an impurity concentration n=5×$10^{16}$ cm$^{-3}$) 66 having a uniform wide band gap, an n-type $Al_xGa_{1-x}As$ graded collector layer (having a thickness of 500 Å and an impurity concentration n=2×$10^{16}$ cm$^{-3}$ and Al mole fraction x=0→0.2) 68, an n-type GaAs collector layer (having a thickness of 2250 Å and an impurity concentration n=2×$10^{16}$ cm$^{-3}$) 610 having a uniform narrow bandgap and an n-type GaAs subcollector layer (having a thickness of 1000 Å and an impurity concentration n=5×$10^{18}$ cm$^{-3}$) 611, which are arranged in this order.

In this example, the graded collector layer 64 that serves as the sub-region, the wide bandgap collector layer 66, the graded collector layer 68 and the narrow bandgap collector layer 610 constitute a collector region. Then, a 2-dimensional doped layer (donor 2-dimensional doping density Ns=4.6×$10^{11}$ cm$^{-2}$) 65 doped with a donor impurity is formed at the interface between the graded collector layer 64 and the wide bandgap collector layer 66. A 2-dimensional doped layer (donor 2-dimensional doping density Ns=2.3×$10^{11}$ cm$^{-2}$) 67 doped with a donor impurity is formed at the interface between the wide bandgap collector layer 66 and the graded collector layer 68. A 2-dimensional doped layer (acceptor 2-dimensional doping density Ns=2.3×$10^{11}$ cm$^{-2}$) 69 doped with an acceptor impurity is formed at the interface between the graded collector layer 68 and the narrow bandgap collector layer 610. The values of the 2-dimensional doping densities Ns of the 2-dimensional doped layers 65, 67 and 69 are set on the basis of the aforementioned equation (2).

FIGS. 6A and 6B show that a band edge Ec of a conduction band is continuous and smooth in the collector region. Therefore, the mobile charge carriers can pass through the collector region from the base region without encountering any barrier.

Figure 3A:
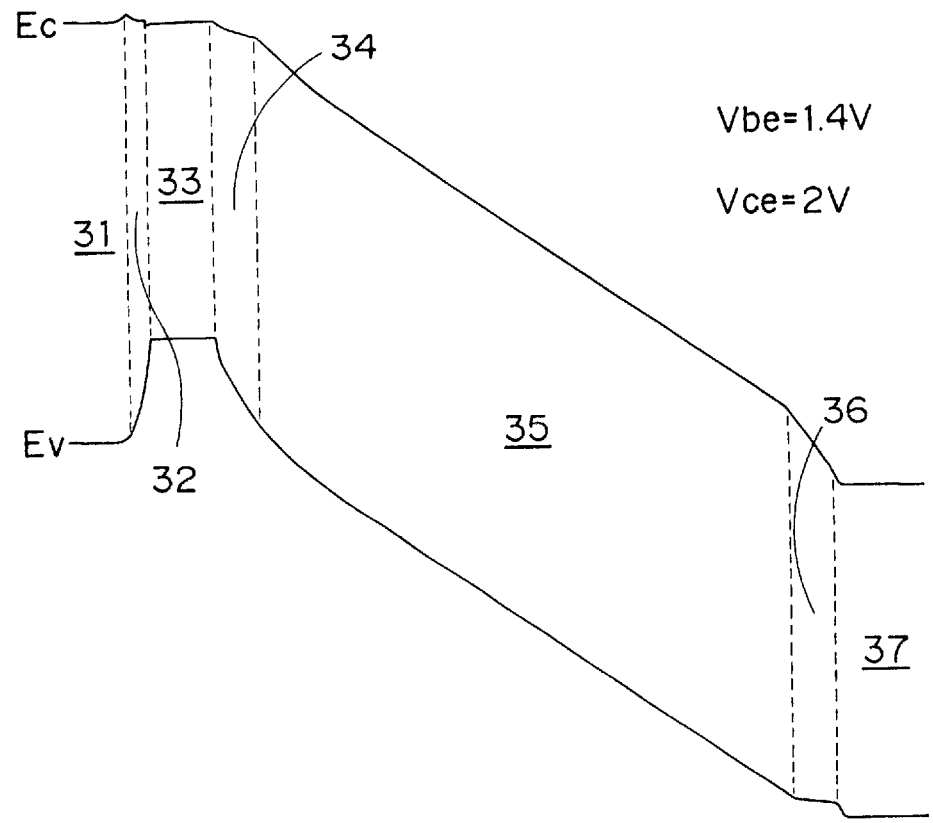
FIGS. 3A and 3B are energy band diagrams of a prior art double heterojunction bipolar transistor.
Figure 3B:
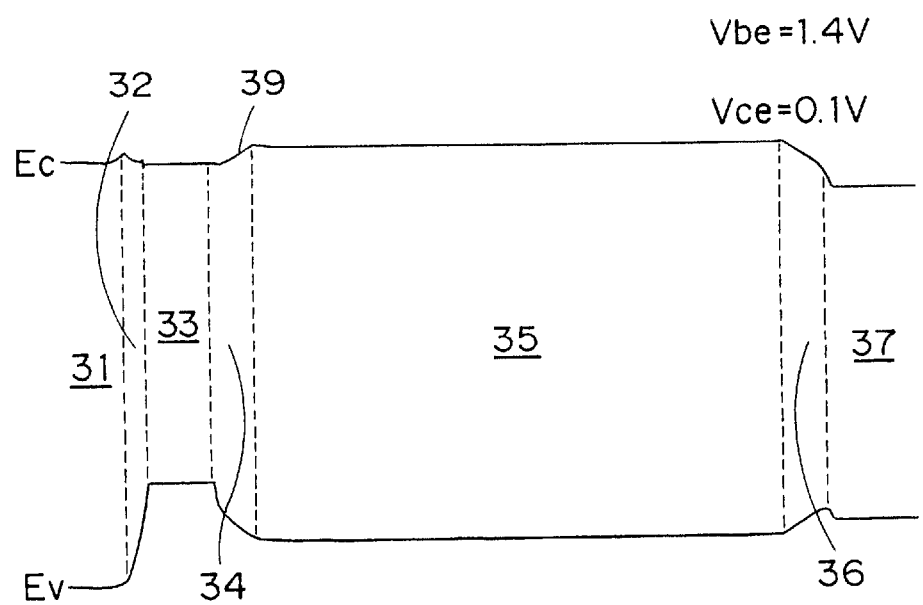
Figure 4A:
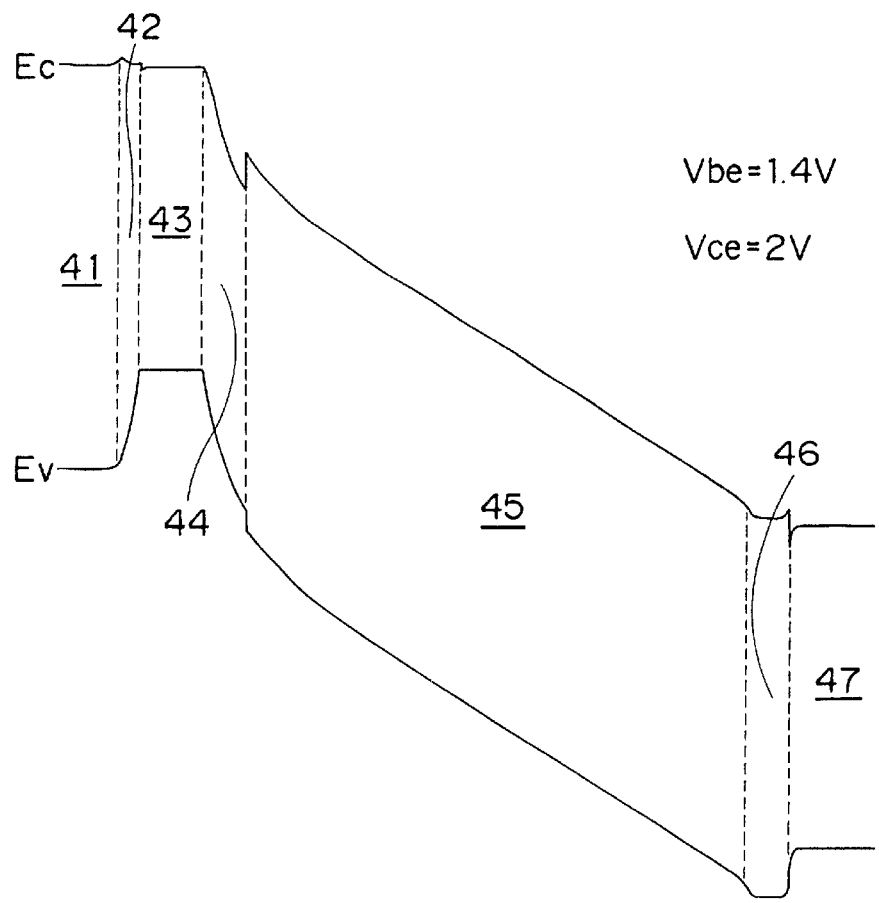
FIGS. 4A and 4B are energy band diagrams of another prior art double heterojunction bipolar transistor.
Figure 4B:
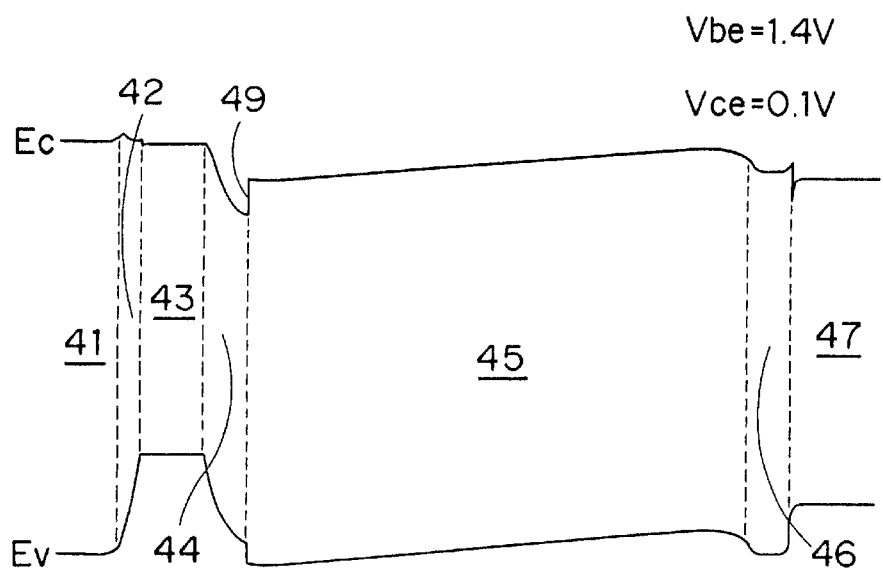
Figure 5A:
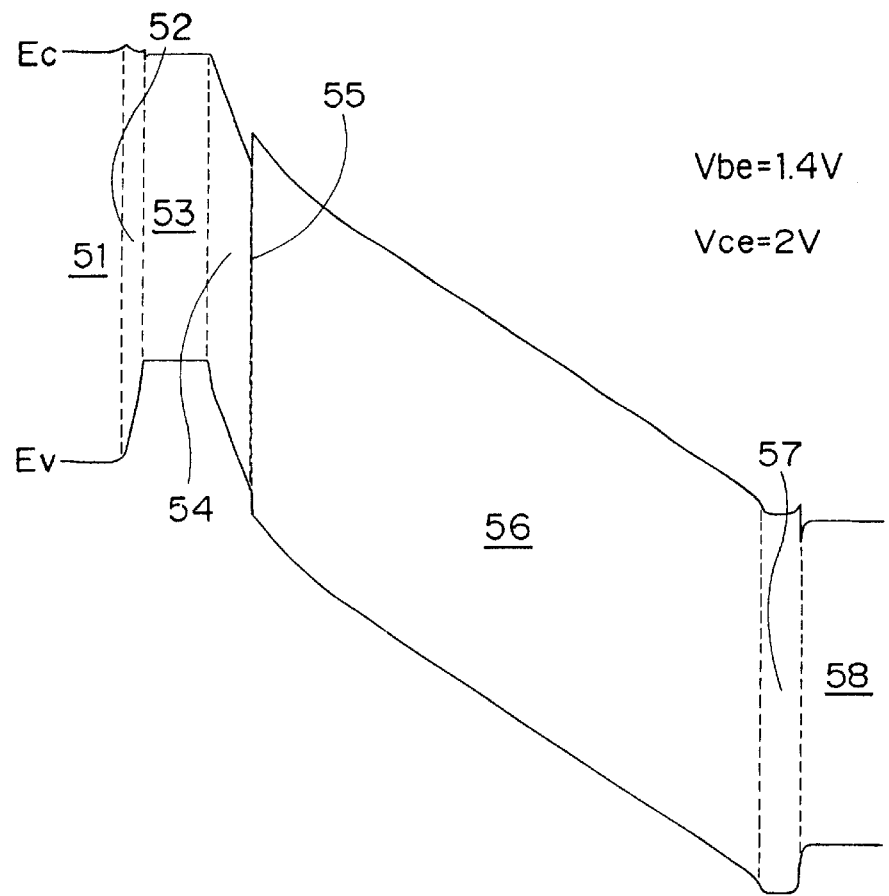
FIGS. 5A and 5B are energy band diagrams of yet another prior art double heterojunction bipolar transistor.
Figure 5B:
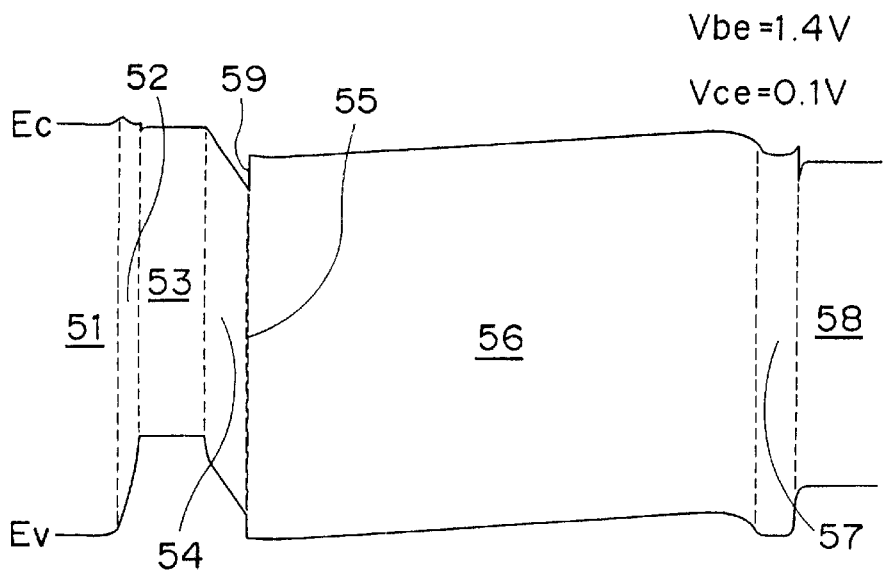
Figure 7:
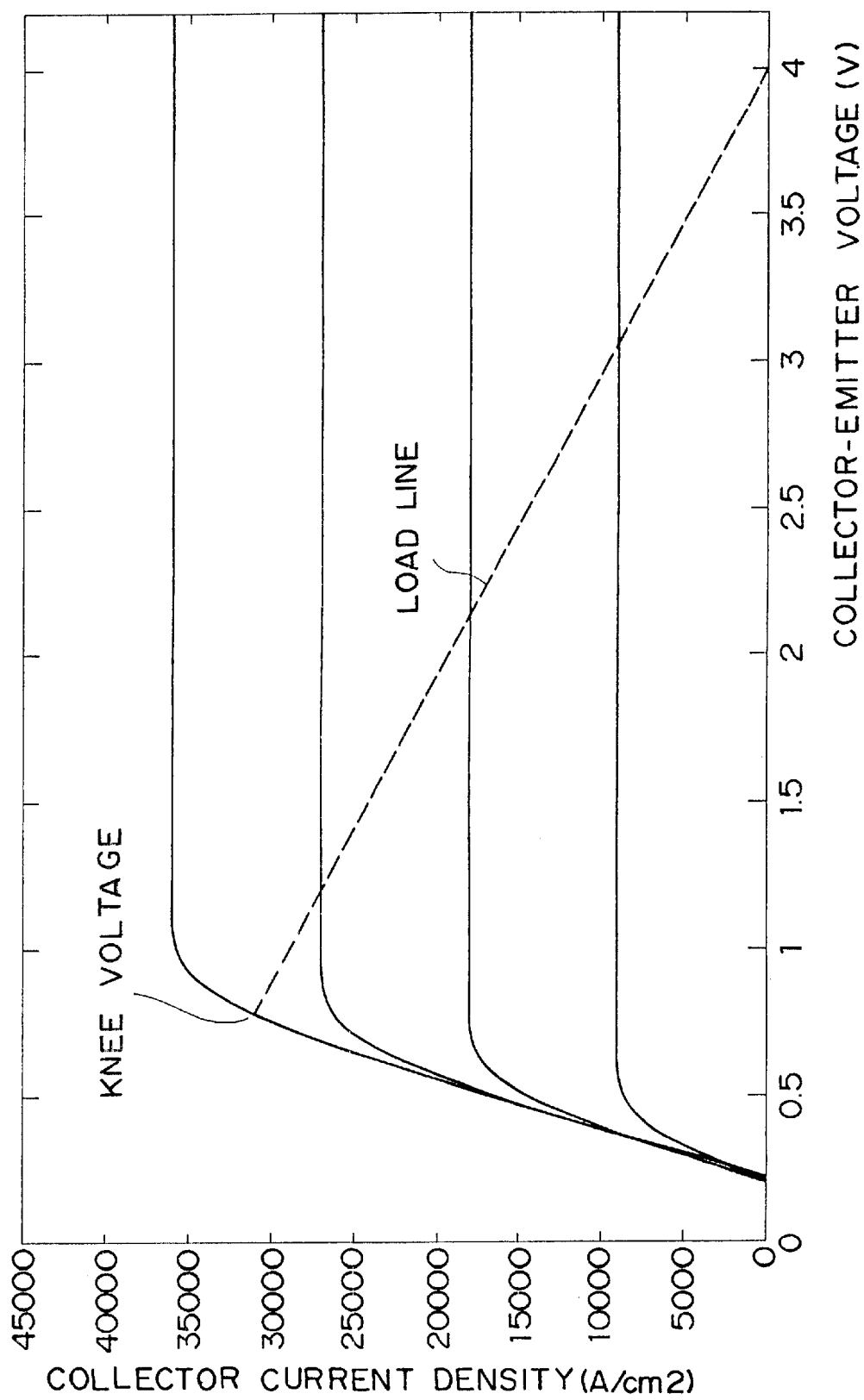
FIG. 7 is a graph for explaining the fact that an operating efficiency of a double heterojunction bipolar transistor basically depends on a knee voltage or turn-on voltage of a device.
Figure 8:
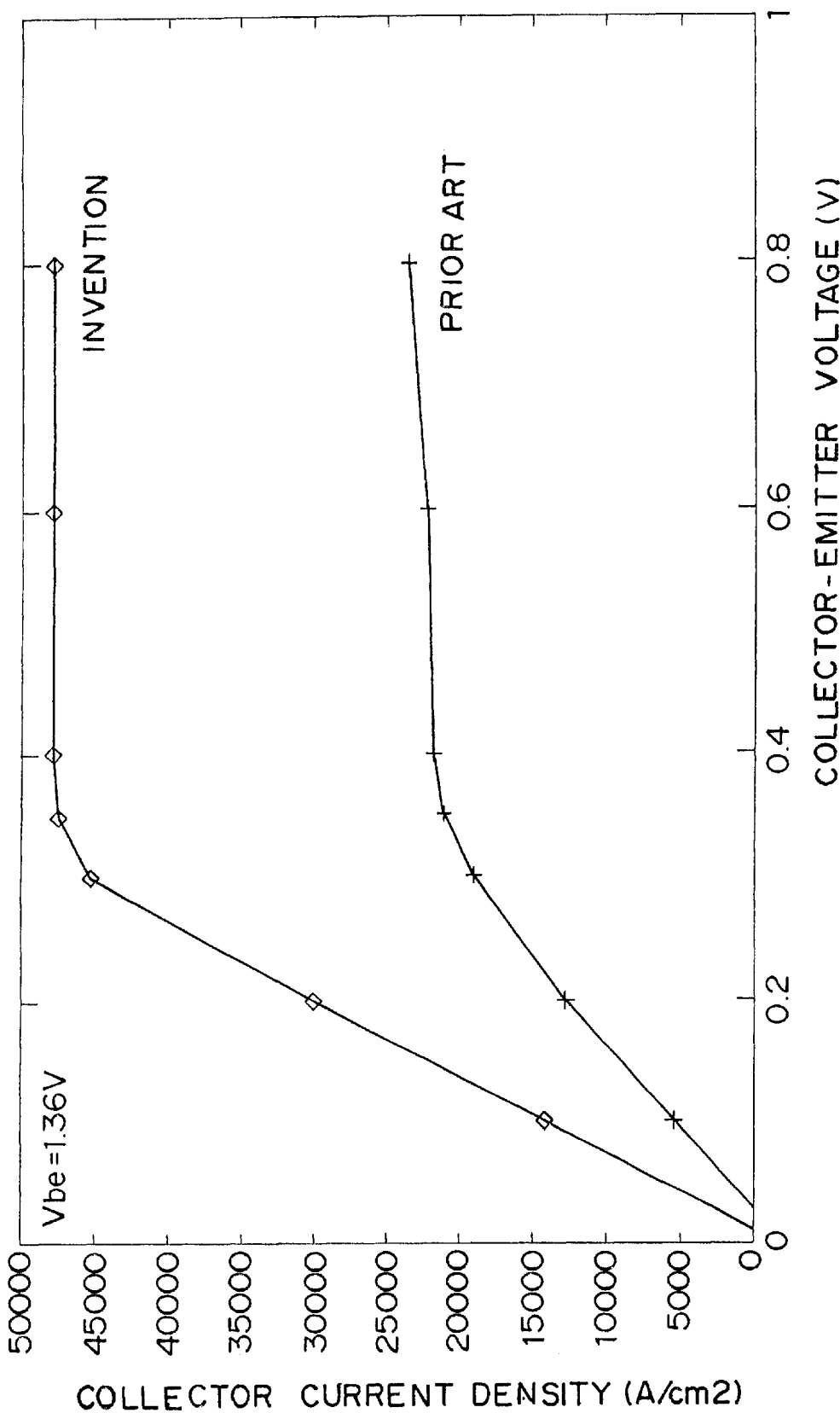
FIG. 8 is a graph showing the collector current density-to-collector voltage characteristics of the present invention (the heterojunction bipolar transistors of FIGS. 6A and 6B) and the prior art product (double hetero-junction bipolar transistor of FIGS. 3A and 3B).

An operating efficiency of the heterojunction bipolar transistor of this type is fundamentally dependent on a knee voltage or turn-on voltage of the device, because the maximum amplitude of the output voltage is determined on the load line as shown in FIG. 7. FIG. 8 shows collector current density-collector voltage characteristics of both the present invention (heterojunction bipolar transistor of FIG. 6) and the prior art product (heterojunction bipolar transistor of FIG. 3) calculated by comparison. It is apparent that the knee voltage of the device structure of the present invention is sufficiently lower than that of the prior art heterojunction bipolar transistor and that greater device efficiency can be produced by the former.

The invention being thus described, it will be obvious that the same may be varied in many ways. Such variations are not be regarded as a departure from the spirit and scope of the invention, and all such modifications as would be obvious to one skilled in the art are intended to be included within the scope of the following claims.

What is claimed is:

1. A heterojunction bipolar transistor having an emitter region, a base region, a collector region and a subcollector region, which are sequentially arranged in one direction, wherein the collector region includes a plurality of adjacent sub-regions with respect to a thickness direction in which mobile charge carriers move, an energy bandgap in each of the sub-regions is either constant or linearly changes with a position in the thickness direction, an energy band edge where the mobile charge carriers in the collector region run is continuous between the adjacent sub-regions, and a 2-dimensional or quasi-2-dimensional charge layer is formed at an interface between the adjacent sub-regions so as to compensate a quasi-electric field caused by differences in electron affinity and energy bandgap between the adjacent sub-regions.

2. The heterojunction bipolar transistor as claimed in claim 1, wherein the heterojunction bipolar transistor is an npn type transistor, the energy band edge of a conduction band is continuous between the adjacent sub-regions, and a 2-dimensional charge density Ns of the 2-dimensional or quasi-2-dimensional charge layer is set so as to satisfy a relationship shown by a following expression (1):

$$Ns=(\epsilon_1 d_{\chi_1}/dz-\epsilon_2 d_{\chi_2}/dz)/q \qquad (1)$$

where q is an electron charge, $\chi_1$ and $\chi_2$ are an electron affinity of a first sub-region and a second sub-region between which the charge layer is interposed, $\epsilon_1$ and $\epsilon_2$ are a permittivity at an interface between the first sub-region and the second sub-region, and z is a coordinate system which is perpendicular to the interface between the first sub-region and the second sub-region and in which a direction directed from the first sub-region to the second sub-region is positive.

3. The heterojunction bipolar transistor as claimed in claim 2, wherein the plurality of sub-regions are made of $Al_xGa_{1-x}As$, an Al mole fraction x of each of the sub-regions is constant or linearly changes with the position in the thickness direction, the Al mole fractions x of the adjacent sub-regions are coincident with each other at the interface between the adjacent sub-regions, a 2-dimensional or quasi-2-dimensional charge layer is formed at the interface of the adjacent sub-regions, and the 2-dimensional charge density Ns of the 2-dimensional or quasi-2-dimensional charge layer is set so as to satisfy a relationship shown by a following expression (2):

$$Ns=0.8\epsilon(dx_1/dz-dx_2/dz)/q \qquad (2)$$

where q is the electron charge, $x_1$ and $x_2$ are an Al mole fraction of the first sub-region and the second sub-region between which the charge layer is interposed, $\epsilon$ is a permittivity at the interface between the first sub-region and the second sub-region, and z is the coordinate system which is perpendicular to the interface between the first sub-region and the second sub-region and in which a direction directed from the first sub-region to the second sub-region is positive.

4. The heterojunction bipolar transistor as claimed in claim 1, wherein the heterojunction bipolar transistor is a pnp type transistor, the energy band edge of a valence band is continuous between the adjacent sub-regions, and a 2-dimensional charge density Ns of the 2-dimensional or quasi-2-dimensional charge layer is set so as to satisfy a relationship shown by a following expression (3):

$$Ns=(\epsilon_1 d_{\chi_1}/dz-\epsilon_2 d_{\chi_2}/dz+(dE_{G1}/dz-dE_{G2}/dz)/q)/q \qquad (3)$$

where q is an electron charge, $\chi_1$ and $\chi_2$ are an electron affinity of a first sub-region and a second sub-region between which the charge layer is interposed, $\epsilon_1$ and $\epsilon_2$ are a permittivity at an interface between the first sub-region and the second sub-region, z is a coordinate system which is perpendicular to the interface of the first sub-region and row the second sub-region and in which a direction directed from the first sub-region to the second sub-region is positive, and $E_{G1}$ and $E_{G2}$ are an energy gap of the first sub-region and second sub-region.

5. The heterojunction bipolar transistor as claimed in claim 4, wherein the plurality of sub-regions are made of $Al_xGa_{1-x}As$, an Al mole fraction x of the sub-region is constant or linearly changes with the position in the thickness direction, the Al mole fractions x of the adjacent sub-regions are coincident with each other at the interface between the adjacent sub-regions, a 2-dimensional or quasi-2-dimensional charge layer is formed on the interface between the sub-regions, and the 2-dimensional charge density Ns of the charge layer is set so as to satisfy a relationship shown by a following expression (4):

$$Ns=0.45\epsilon(dx_1/dz-dx_2/dz)/q \qquad (4)$$

where q is the electron charge, $x_1$ and $x_2$ are an Al mole fraction of the first sub-region and the second sub-region between which the charge layer is interposed, $\epsilon$ is an permittivity at the interface between the first sub-region and the second sub-region, and z is a coordinate system which is perpendicular to the interface between the first sub-region and the second sub-region and in which a direction directed from the first sub-region to the second sub-region is positive.

6. The heterojunction bipolar transistor as claimed in claim 3, wherein the collector region is comprised of the first sub-region located on a base layer side and the second sub-region located on a subcollector side, and the Al mole fraction x of each of the sub-regions is set so as to linearly increase toward the second sub-region within the first sub-region and linearly decrease toward the subcollector region within the second sub-region.

* * * * *